United States Patent
Venturino et al.

(10) Patent No.: US 10,423,081 B2
(45) Date of Patent: Sep. 24, 2019

(54) RETICLE COOLING BY NON-UNIFORM GAS FLOW

(71) Applicants: ASML Holding N.V., Veldhoven (NL); ASML Netherlands B.V., Veldhoven (NL)

(72) Inventors: Thomas Venturino, Wilton, CT (US); Geoffrey Alan Schultz, Wilton, CT (US); Daniel Nicholas Galburt, Wilton, CT (US); Daniel Nathan Burbank, Wilton, CT (US); Santiago E. Delpuerto, Wilton, CT (US); Herman Vogel, Wilton, CT (US); Johannes Onvlee, Veldhoven (NL); Laurentius Johannes Adrianus Van Bokhoven, Veldhoven (NL); Christopher Charles Ward, Wilton, CT (US)

(73) Assignees: ASML Holding N.V., Veldhoven (NL); ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/540,649

(22) PCT Filed: Dec. 2, 2015

(86) PCT No.: PCT/EP2015/078318
§ 371 (c)(1),
(2) Date: Jun. 29, 2017

(87) PCT Pub. No.: WO2016/107714
PCT Pub. Date: Jul. 7, 2016

(65) Prior Publication Data
US 2017/0363973 A1 Dec. 21, 2017

Related U.S. Application Data

(60) Provisional application No. 62/111,558, filed on Feb. 3, 2015, provisional application No. 62/098,979, filed on Dec. 31, 2014.

(51) Int. Cl.
*G03F 7/20* (2006.01)

(52) U.S. Cl.
CPC .............................. *G03F 7/70875* (2013.01)

(58) Field of Classification Search
CPC .................................................. G03F 7/70875
See application file for complete search history.

(56) References Cited

U.S. PATENT DOCUMENTS 6,415,736 B1   7/2002   Hao et al.
7,270,713 B2   9/2007   Blonigan et al.
(Continued)

FOREIGN PATENT DOCUMENTS

EP   1777590 A2   4/2007
EP   1777590 A3   2/2008
(Continued)

OTHER PUBLICATIONS

International Search Report and Written Opinion directed to International Patent Application No. PCT/EP2015/078318, dated Apr. 22, 2016; 14 pages.
(Continued)

*Primary Examiner* — Michelle M Iacoletti
(74) *Attorney, Agent, or Firm* — Sterne, Kessler, Goldstein & Fox P.L.L.C.

(57) ABSTRACT

An apparatus, system, and method cool a patterning device by supplying a non-uniform gas flow. The apparatus and system include a gas supply structure that supplies a gas flow across the first surface of the patterning device. The gas supply structure includes a gas supply nozzle specially configured to create a non-uniform gas flow distribution. A greater volume or velocity of the gas flow is directed to desired portion of the patterning device.

24 Claims, 11 Drawing Sheets

(56) References Cited

U.S. PATENT DOCUMENTS

| | | |
|---|---|---|
| 2001/0020446 A1 | 9/2001 | Kozarek et al. |
| 2007/0002292 A1 | 1/2007 | Vogel et al. |
| 2009/0073397 A1 | 3/2009 | Vogel et al. |
| 2009/0207394 A1 | 8/2009 | Shibazaki |
| 2012/0025109 A1 | 2/2012 | Abhari et al. |
| 2015/0241796 A1 | 8/2015 | Ebert, Jr. et al. |

FOREIGN PATENT DOCUMENTS

| | | |
|---|---|---|
| EP | 1120690 B1 | 8/2008 |
| EP | 1777590 B1 | 12/2012 |
| JP | H07 92317 A | 4/1995 |
| JP | H11-026376 A | 1/1999 |
| JP | 2002-350054 A | 12/2002 |
| JP | 2003-504842 A | 2/2003 |
| JP | 2004-014960 A | 1/2004 |
| JP | 2004-080059 A | 3/2004 |
| JP | 2006-513323 A | 4/2006 |
| JP | 2007-013172 A | 1/2007 |
| JP | 2009-132194 A | 6/2009 |
| WO | WO 2014/067802 A1 | 5/2014 |
| WO | WO 2014128232 A1 | 8/2014 |

OTHER PUBLICATIONS

International Preliminary Report on Patentability and Written Opinion of the International Searching Authority directed to related International Patent Application No. PCT/EP2015/078318, dated Jul. 4, 2017; 8 pages.

Chinese Supplementary Search from related Chinese Patent Application No. 201580071474.8, dated May 15, 2019; 1 page.

RETICLE COOLING BY NON-UNIFORM GAS FLOW

CROSS-REFERENCE TO RELATED APPLICATIONS

This application claims priority of U.S. 62/098,979 which was filed on Dec. 31, 2014 and U.S. 62/111,558 which was filed on Feb. 3, 2015 and which are incorporated herein in its entirety by reference.

FIELD

The present invention relates to a patterning device temperature control system usable, for example, to control the temperature of a patterning device in a lithography apparatus by using a gas flow across a surface of the patterning device.

RELATED ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning" direction), while synchronously scanning the substrate parallel or anti-parallel to this direction.

In the lithographic apparatus, the radiation beam may cause thermal responses in the reticle. Transmissive parts of the reticle do not absorb much energy from the radiation beam. Non-transmissive materials, however, may absorb a large amount of thermal energy. This absorbed energy turns into heat, which causes the reticle to heat up and expand. When the reticle expands, image distortion (such as overlay error) results.

Additionally, the heated reticle can, in turn, heat the air adjacent the reticle. This adverse effect creates variations in a so-called gas lens between the reticle and the projection lens system. As a result, residual overlay error from reticle heating may be approximately 1 to 2 nm unless compensated. Thus, reticle heating acts as a major contributor to overlay error in the lithography system.

To address alignment error that results from the thermal expansion of the reticle, existing systems rely on reticle or wafer alignment, magnification correction, feed forward systems for expansion prediction, and lens correction. The tolerances for image distortion and overlay accuracy have been large enough in the past that such alignment and correction have been sufficient to address overlay error. With tighter tolerances for overlay error in new and developing systems, the above types of correction are no longer sufficient.

SUMMARY

Accordingly, there is a need for improved systems and methods for addressing distortions and errors caused by the interaction between radiation beams and patterning devices.

In one embodiment, a temperature control system includes a support configured to support an object, the object having a first surface and a second surface, and a gas supply nozzle, the gas supply nozzle configured to supply a gas flow across the first surface and configured to produce a non-uniform gas flow profile exiting the nozzle by unevenly distributing a volume or a velocity of the gas flow.

In another embodiment, a lithographic apparatus includes an illumination system configured to condition a radiation beam. The lithographic apparatus further includes a support configured to support a patterning device, the patterning device having a first surface and a second surface. The patterning device is configured to impart the radiation beam with a pattern in its cross-section to form a patterned radiation beam. The lithographic apparatus includes a gas supply nozzle coupled to or integral with the support, the gas supply nozzle configured to supply a gas flow across the first surface and configured to produce a non-uniform gas flow profile exiting the nozzle by unevenly distributing a volume or a velocity of the gas flow.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing such embodiments in more detail, however, it is instructive to present an example environment in which embodiments of the present invention may be implemented.

Example Reflective and Transmissive Lithographic Systems

Figure 1A:
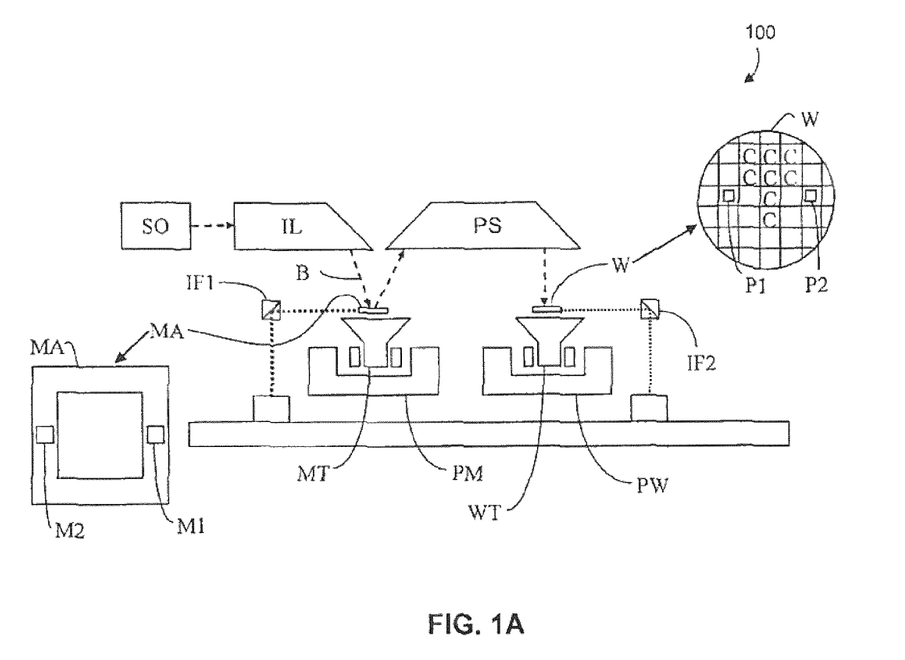
FIG. 1A is a schematic illustration of a reflective lithographic apparatus according to an embodiment of the invention.
Figure 1B:
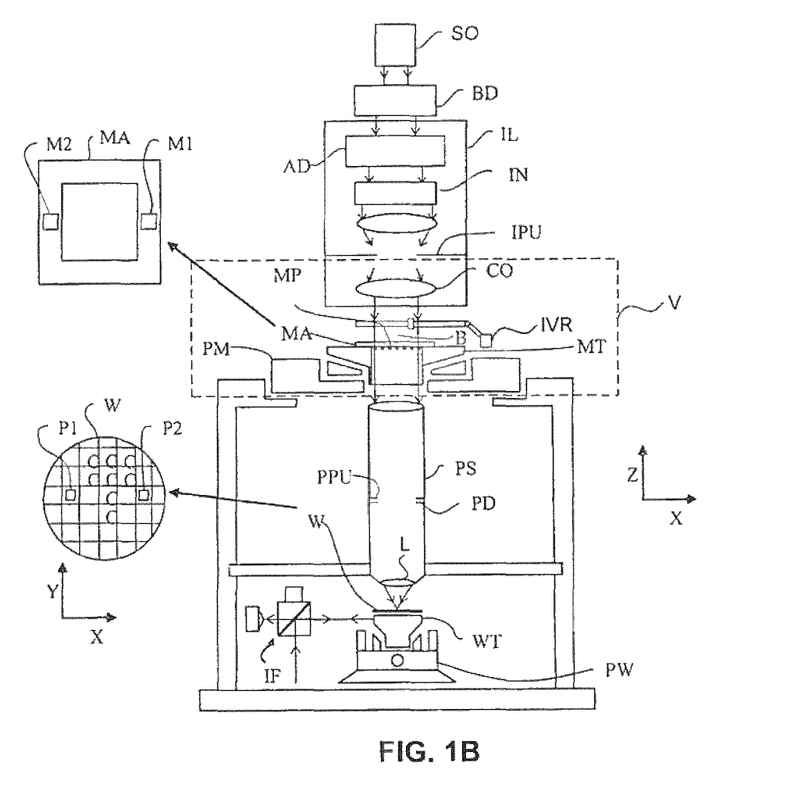
FIG. 1B is a schematic illustration of a transmissive lithographic apparatus according to an embodiment of the invention.

FIGS. 1A and 1B are schematic illustrations of a lithographic apparatus 100 and lithographic apparatus 100', respectively, in which embodiments of the present invention may be implemented. Lithographic apparatus 100 and lithographic apparatus 100' each include the following: an illumination system (illuminator) IL configured to condition a radiation beam B (for example, DUV or EUV radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatuses 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, magnetic, electromagnetic, electrostatic, or other types of optical components, or any combination thereof, for directing, shaping, or controlling the radiation B.

The support structure MT holds the patterning device MA in a manner that depends on the orientation of the patterning device MA, the design of the lithographic apparatuses 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. The support structure MT can ensure that the patterning device is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C, such as an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B which is reflected by the mirror matrix.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables (and/or two or more mask tables) WT. In such "multiple stage" machines, the additional substrate tables WT can be used in parallel, or preparatory steps can be carried out on one or more tables while one or more other substrate tables WT are being used for exposure.

Referring to FIGS. 1A and 1B, the illuminator IL receives a radiation beam from a radiation source SO. The source SO and the lithographic apparatuses 100, 100' can be separate entities, for example, when the source SO is an excimer laser. In such cases, the source SO is not considered to form part of the lithographic apparatuses 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatuses 100, 100'—for example when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil PPU conjugate to an illumination system pupil IPU. Portions of radiation emanate from the intensity distribution at the illumination system pupil IPU and traverse a mask pattern without being affected by diffraction at a mask pattern create an image of the intensity distribution at the illumination system pupil IPU.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber, where an in-vacuum robot IVR can be used to move patterning devices such as a mask, similar to patterning device MA, in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatuses 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to herein.

Combinations and/or variations on the described modes of use or entirely different modes of use can also be employed.

Although specific reference can be made in this text to the use of lithographic apparatus in the manufacture of ICs, it should be understood that the lithographic apparatus described herein can have other applications, such as the manufacture of integrated optical systems, guidance and detection patterns for magnetic domain memories, flat-panel displays, liquid-crystal displays (LCDs), and thin-film magnetic heads. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (a tool that typically applies a layer of resist to a substrate and develops the exposed resist), a metrology tool, and/or an inspection tool. Where applicable, the disclosure herein can be applied to such and other substrate processing tools.

Further, the substrate can be processed more than once, for example, in order to create a multi-layer IC, so that the term substrate used herein can also refer to a substrate that already contains multiple processed layers.

In a further embodiment, lithographic apparatus 100 includes an extreme ultraviolet (EUV) source, which is configured to generate a beam of EUV radiation for EUV lithography. In general, the EUV source is configured in a radiation system (see below), and a corresponding illumination system is configured to condition the EUV radiation beam of the EUV source.

In the embodiments described herein, the terms "lens" and "lens element," where the context allows, can refer to any one or combination of various types of optical components, including refractive, reflective, magnetic, electromagnetic, and electrostatic optical components.

Further, the terms "radiation" and "beam" used herein encompass all types of electromagnetic radiation, including ultraviolet (UV) radiation (for example, having a wavelength λ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by air), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

Exemplary Embodiments of the Patterning Device Temperature Control System

Figure 2:
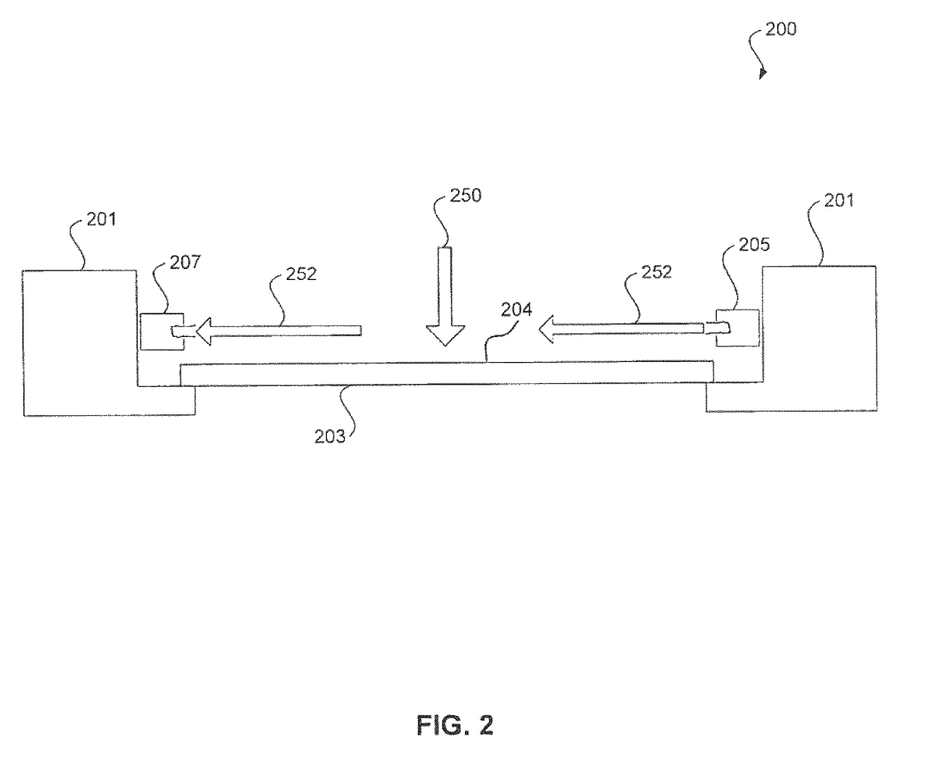
FIG. 2 is a schematic illustration of a side view of a patterning device support according to an embodiment of the invention.

FIG. 2 illustrates a side view of a patterning device temperature control system 200 according to an exemplary embodiment of the invention. In one example, cooling sub-system 200 includes patterning device support 201, patterning device 203 including a top surface 204, gas supply nozzle 205, gas extractor 207, radiation beam 250, and gas flow 252.

Patterning device support 201, for example a reticle stage, supports patterning device 203. Radiation beam 250, such as the radiation beam B discussed in FIGS. 1A and 1B above, is incident on patterning device 203. Patterning device 203 may be a reticle or other type of transmissive or reflective mask. As radiation beam 250 is incident on, and passes through, patterning device 203, patterning device 203 absorbs some energy from radiation beam 250, which causes thermal expansion.

Gas supply 205 may be integrated with one side of patterning device support 201, while gas extractor 207 may be integrated with another, opposing side of the patterning device support 201. Alternatively, gas supply 205 and gas extractor 207 may be coupled to opposing surfaces of patterning device support 201 facing the patterning device 203. Alternatively, gas supply 205 and gas extractor 207 may be coupled to an additional frame (not shown) near to support 201 which moves substantially equal to support 201 such that the additional frame follows support 201. Alternatively gas extractor 207 may be coupled to a stationary frame and configured with sufficient extraction dimensions such that the patterning device 203 overlaps the extraction during all relevant motion of the support 201. Alternatively, any combination of gas supply 205 and gas extractor 207 configurations mentioned above can be utilized. According to one embodiment, the gas extractor 207 may be omitted.

Gas supply 205 and gas extractor 207 may be part of a cooling sub-system 200 that is designed to reduce the temperature increase of the patterning device 203 through the use of gas flow. According to one embodiment, gas supply 205 and gas extractor 207 may each be situated so as to be in close proximity (such as adjacent) to the same surface of patterning device 203. In FIG. 2, gas supply 205 and gas extractor 207 are situated close to top surface 204 of patterning device 203. Gas supply 205 provides a gas flow 252 that flows across top surface 204 of patterning device 203. In FIG. 2, gas flow 252 is across and roughly parallel to top surface 204 of patterning device 203. Gas extractor 207 extracts gas flow 252 as the flow reaches the opposite end of patterning device 203.

In an alternative embodiment, patterning device 203 is a reflective patterning device, such as a reflective reticle, as discussed with respect to FIG. 1A above (not shown in FIG. 2). Radiation beam 250 is incident on patterning device 203, but would be reflected from patterning device 203. In such circumstances, patterning device 203 is subject to heating and degrading effects from the resulting thermal expansion of patterning device 203. Gas supply 205 and gas extractor 207 could be integrated with patterning device support 201, so that each could be within close proximity to a surface of patterning device 203, as discussed and including the same alternatives discussed above.

In the above manner, gas flow 252 introduced across top surface 204 of patterning device 203 operates to reduce and/or maintain a certain temperature of the patterning device 203. For example, gas flow 252 may counter the effects of thermal expansion on the patterning device 203 by reducing or negating heating of the patterning device 203. In one embodiment, the cooling sub-system 200 may maintain the patterning device 203 at or near 22° C. The skilled artisan will appreciate that other target temperatures are possible and/or may be more desirable for a given application.

Although a parallel flow of gas effectively cools patterning device 203 and improves performance, it may, however, create a non-uniform cooling pattern across the x-axis of patterning device 203, where the x-axis is the axis substantially parallel to the direction of the gas flow 252. Under these circumstances, it may be desirable to create a more uniform cooling pattern across patterning device 203. Additionally, it may be desirable to symmetrically cool along the x-axis and/or y-axis. A nozzle 205 that intentionally creates a non-uniform flow may be used to improve uniformity of heat transfer across the surface.

In one example, uniform velocity over top surface 204 of patterning device 203 may improve uniform cooling of patterning device 203. When moving gas from the nozzle 205 interfaces with stagnant gas adjacent to the patterning device 203, however, a shearing force causes the moving gas to lose momentum. This momentum loss is may not be uniform, i.e., certain portions of the gas flow lose more momentum than others. Thus, uniform velocity across top surface 204 (and, therefore, uniform cooling) may not be accomplished with a uniform velocity and volume of gas flow exiting the nozzle.

Figure 10:
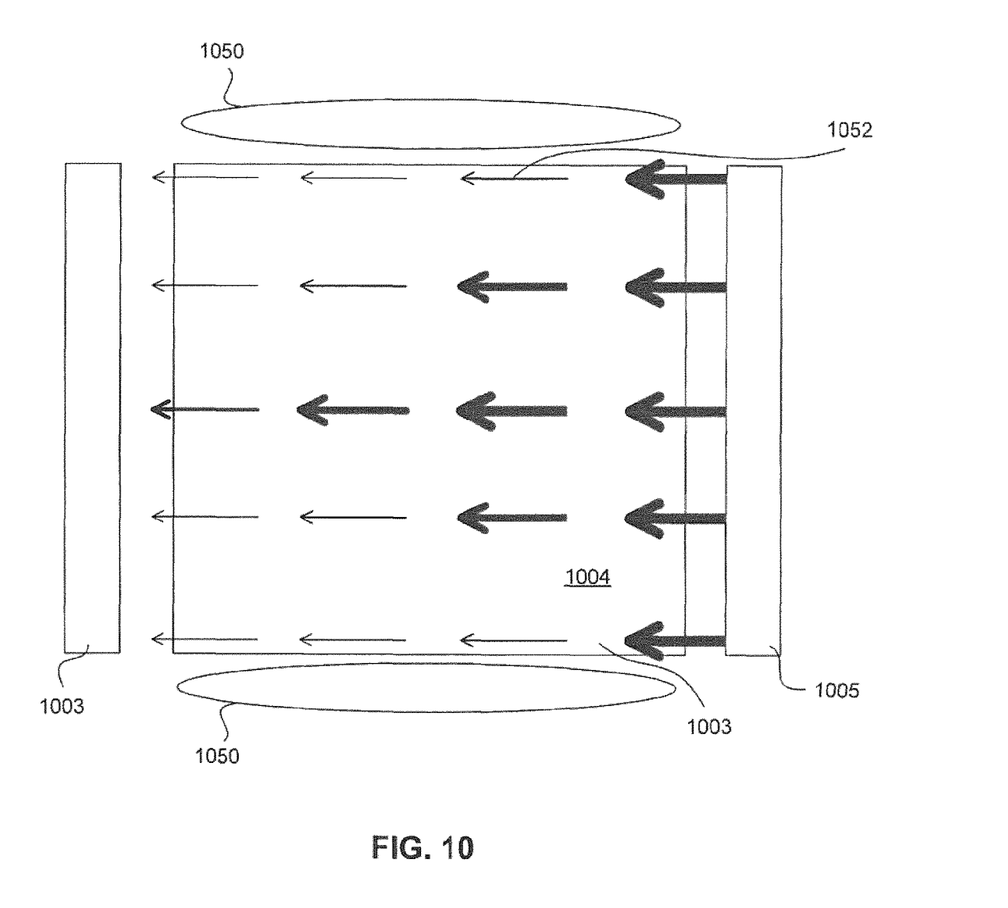
FIG. 10 is a schematic illustration of an overhead view of a comparative embodiment.

For the sake of comparison, FIG. 10 shows a top view of pattering device 1003 and illustrates the effect of these shearing forces on a uniform velocity of gas flow 1052 exiting nozzle 1005. The arrow thickness of gas flow 1052 is approximately proportional to the gas flow velocity near top surface 1004 of patterning device 1003. In the case of gas flow 1052 exiting gas supply nozzle 1005 at substantially uniform velocity, gas flow 1052 slows down along the flow direction more at the edges of patterning device 1003 due to shearing with substantially stagnant gas 1050 than at the middle of patterning device 1003.

To compensate for the loss of momentum the nozzle 205 may distribute a greater volume or a greater velocity of gas flow to the areas that would otherwise experience reduced cooling. For example, in one exemplary embodiment, an elongated nozzle 205 running along one side of patterning device 203 may direct a greater volume gas toward the outer portions of patterning device 203 (i.e. portions near the edges of top surface 204) relative to the inner portions of patterning device 203 (i.e. portions at the center of top surface 204). In one example, the outermost portions of the flow profile may distribute approximately 25% more volume to either side of patterning device 203 compared to the middle of patterning device 203. This may be achieved through the use of a novel nozzle arrangement to increase the volume of gas flow directed towards the area over patterning device 203 with deficient cooling power. In another exemplary embodiment, a nozzle 205 may direct higher velocity air towards the areas with deficient cooling power. In yet another exemplary embodiment, a nozzle 205 may include two or more nozzles tips (not shown) directed towards different portions of patterning device 203. Exemplary nozzle arrangements are shown in FIGS. 3-9 and discussed below.

Exemplary Embodiments of the Gas Supply Nozzle

FIGS. 3-9 illustrate nozzle arrangements according to various embodiments. The gas supply nozzles 305, 405, 505, 605, 705, 805, and 905 and corresponding gas extractor nozzles (not shown) are each approximately equal in length to the length of the patterning device (not shown).

In these example configurations, a flow of gas, such as the flow of gas 252 from FIG. 2, is able to adequately reach approximately an entirety of top surface 204 of patterning device 203. As will be recognized by the skilled artisan, gas supply nozzles 205, 305, 405, 505, 605, 705, 805, and 905 and the corresponding gas extractor nozzles (e.g., 207) may be longer, or shorter, than the length of the patterning device (e.g., 203), without departing from the general concept of the present invention.

Figure 3:
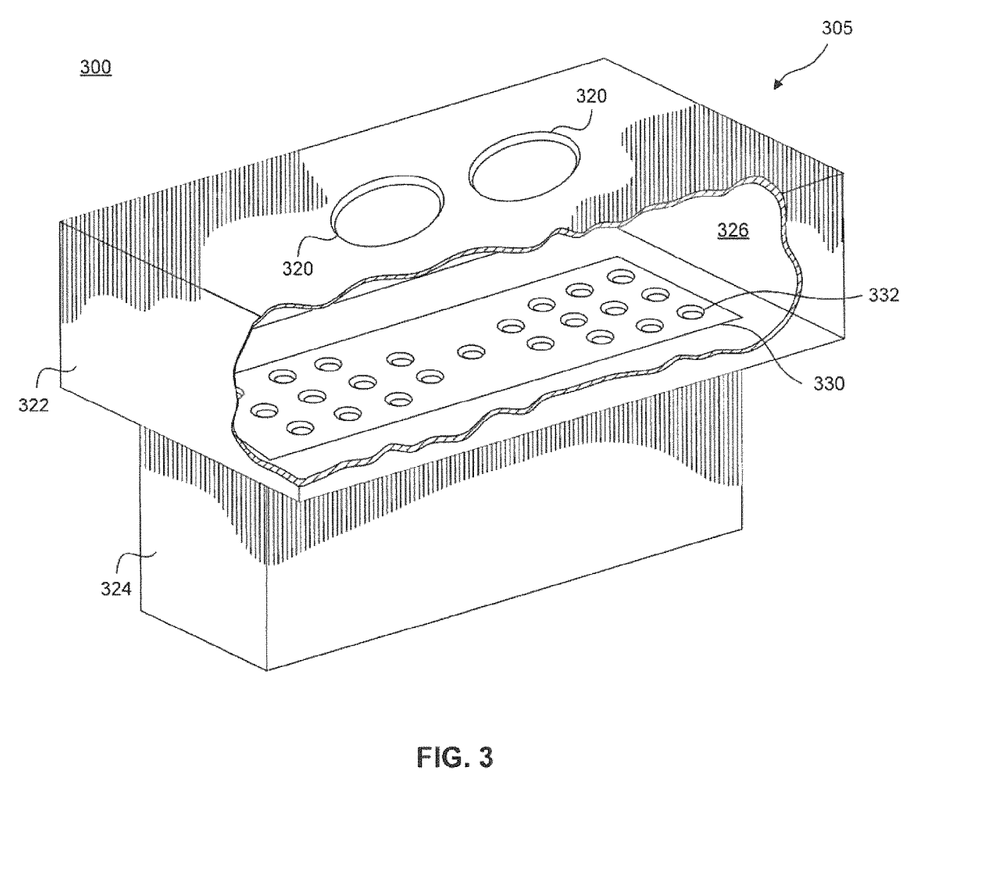
FIG. 3 illustrates a first nozzle arrangement according to an exemplary embodiment of the invention.

A first exemplary nozzle arrangement 300 including nozzle 305 is schematically illustrated in FIG. 3. Gas supply nozzle 305 has a housing 322 (enclosing a nozzle cavity 326), a flow distribution plate 330 (with an array of holes 332), and a nozzle tip 324. Inlets 320 supply gas to nozzle cavity 326. Flow distribution plate 330 lies between housing 322 and nozzle tip 324 and conditions the gas flow into the nozzle tip 324. In some embodiments, the nozzle tip 324 may be omitted.

Gas flow out of gas supply nozzle 309 is intentionally non-uniform by placing a custom array of holes 332 between cavity 326 and nozzle tip 324. Array of holes 332 ensures that the gas flow exiting the nozzle tip 234 is not distributed evenly across gas supply nozzle 305. In one embodiment the size of holes 332 is constant, but the number and spacing of the holes 332 varies across flow distribution plate 330. In one embodiment, the outer portions of flow distribution plate 330 have a greater number of holes 332 compared to the center of flow distribution plate 330. This arrangement corresponds to a greater volume of gas flow distributed to the outer portions of the top surface of the patterning device (such as top surface 204 of patterning device 203).

Figure 4:
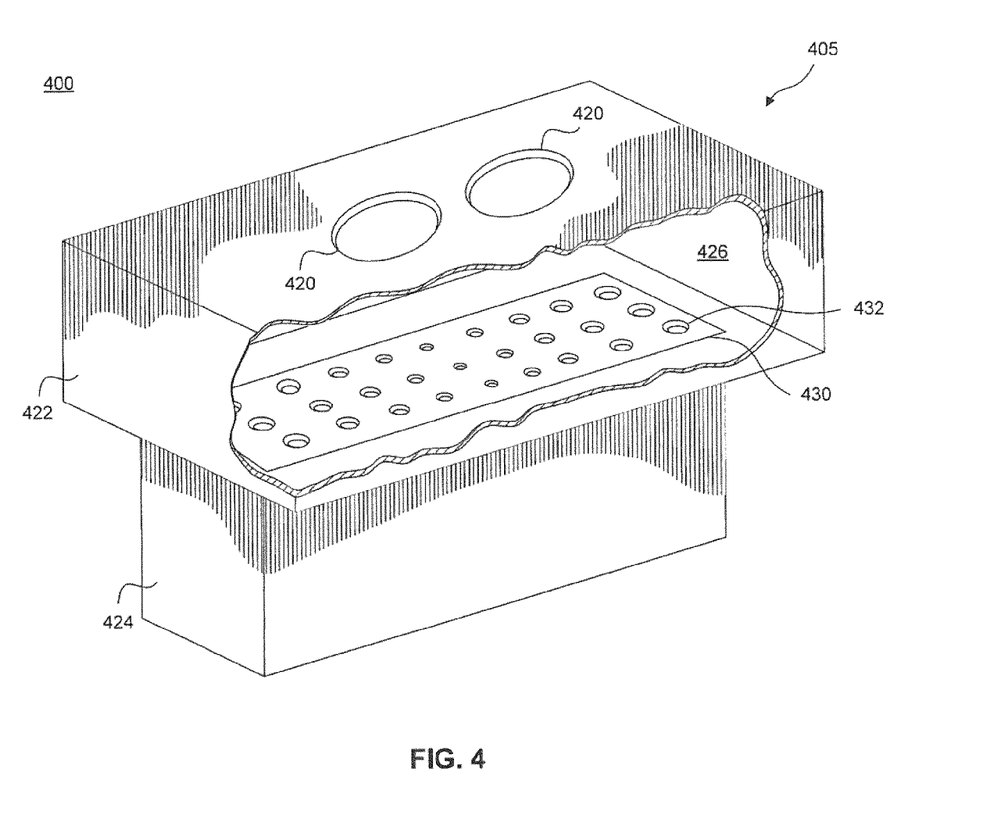
FIG. 4 illustrates a second nozzle arrangement according to an exemplary embodiment of the invention.

The size of the holes, however, need not remain constant. FIG. 4 illustrates second exemplary nozzle arrangement 400 including nozzle 405. Gas supply nozzle 405 has a housing 422 (enclosing a nozzle cavity 426), a flow distribution plate 430 (with an array of holes 432), and a nozzle tip 424. Inlets 420 supply gas to nozzle cavity 426. Flow distribution plate 430 lies between housing 422 and nozzle tip 424 and conditions the gas flow into the nozzle tip 424.

In this example, the number and spacing of holes 432 remains constant across flow distribution plate 430, but the size of holes 432 may vary. Similar to the first exemplary embodiment of FIG. 3, flow distribution plate 430 creates a non-uniform distribution of the gas flow profile exiting gas supply nozzle 409. This second exemplary embodiment may be used to distribute a greater volume of gas flow to the outer portions of the top surface of the patterning device (such as top surface 204 of patterning device 203).

In another example, the number, size, location, and distribution of holes may all be varied and/or non-uniform to achieve the desired flow profile.

It is noted here that the size of gas supply nozzles 305 and 405, as well as the other components of lithography tool 100 and embodiments described herein, are not drawn to scale.

Figure 5:
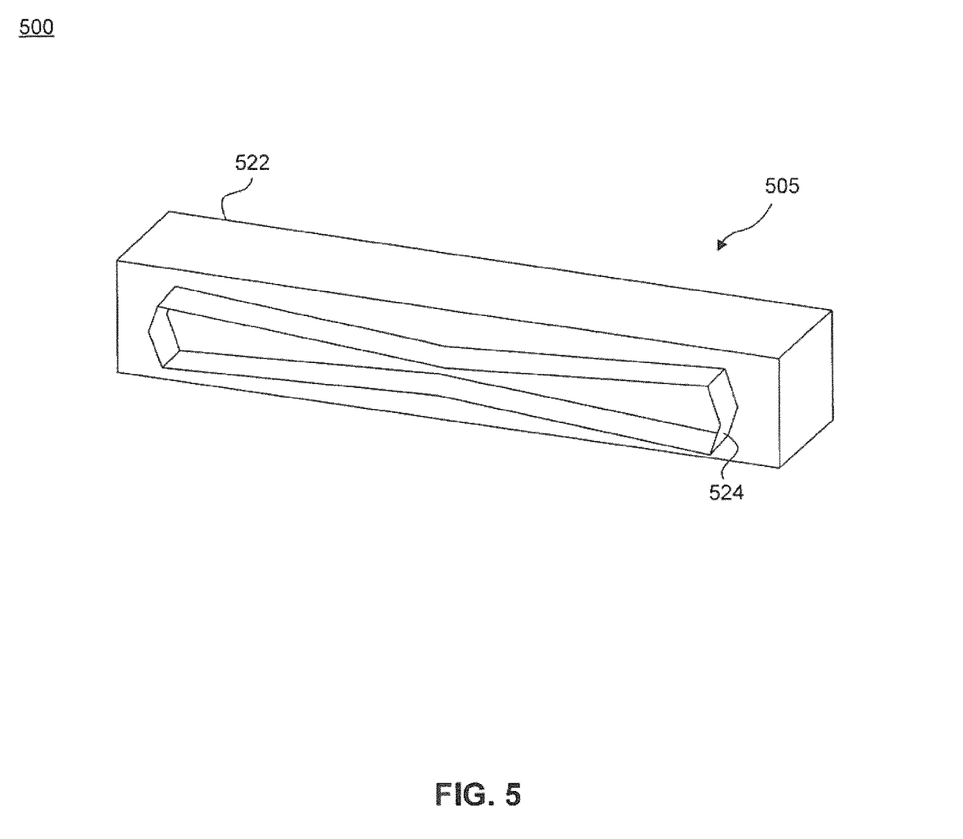
FIG. 5 illustrates a third nozzle arrangement according to an exemplary embodiment of the invention.

In an alternative embodiment, a varying nozzle opening height may be used to create a non-uniform flow profile. As shown in FIG. 5, third exemplary nozzle arrangement 500 has gas supply nozzle 505 including a housing 522 and a nozzle tip 524. Nozzle tip 524 has a shaped nozzle tip opening 534 that varies its height along its width. In one embodiment, shaped nozzle tip opening 534 may take the shape roughly of an hour-glass or a bow-tie, such that a greater volume of gas flow is distributed to the outer portions of the top surface of the patterning device (such as top surface 204 of patterning device 203). The profile of the shaped opening 534 may extend through the length of the nozzle tip 524.

Figure 6:
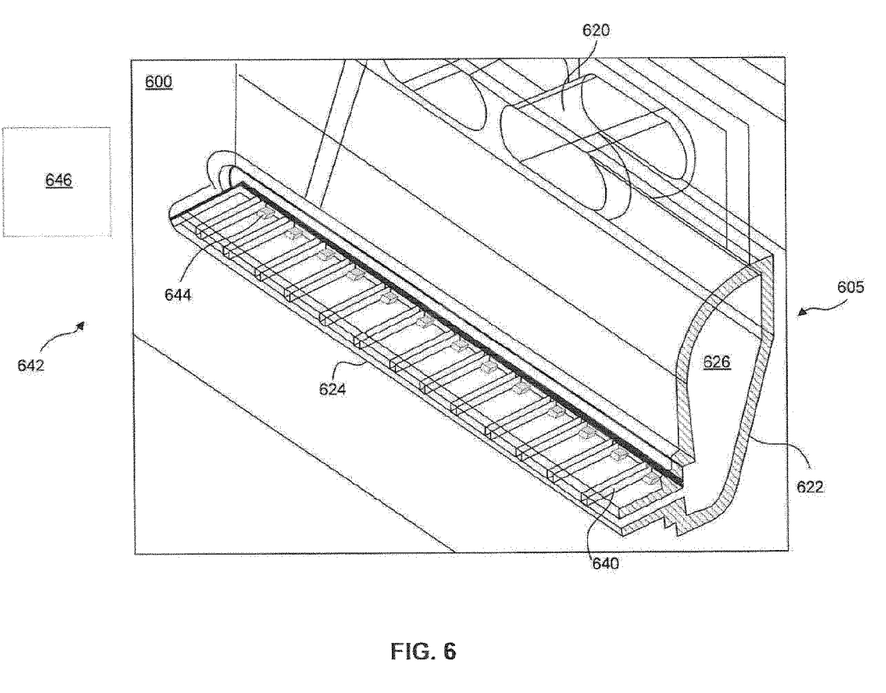
FIG. 6 illustrates a fourth nozzle arrangement according to an exemplary embodiment of the invention.

FIG. 6 is a schematic diagram of gas supply nozzle arrangement 600 according to another embodiment. As shown in FIG. 6, gas supply nozzle 605 has a housing 622 (enclosing a nozzle cavity 626) and a nozzle tip 624. Inlets 620 supply gas to nozzle cavity 626. Nozzle tip 624 includes a plurality of flow directing vanes 640. Flow directing vanes 640 create a non-uniform flow distribution profile across the exit of the gas supply nozzle tip 624. Like the examples described above, this non-uniform flow distribution profile may be used to cool the reticle more uniformly. Flow directing vanes 640 redistribute the gas from inlets 620 to create a predetermined non-uniform flow distribution profile. Like the exemplary embodiment described above, greater volume of gas flow may be directed towards the outer portions of the top surface of the patterning device (such as top surface 204 of patterning device 203) to combat stagnant gas at the outer portions of the patterning device. Alternatively, the flow directing vanes 640 may be positioned further upstream, such as in the nozzle cavity 626.

Figure 7:
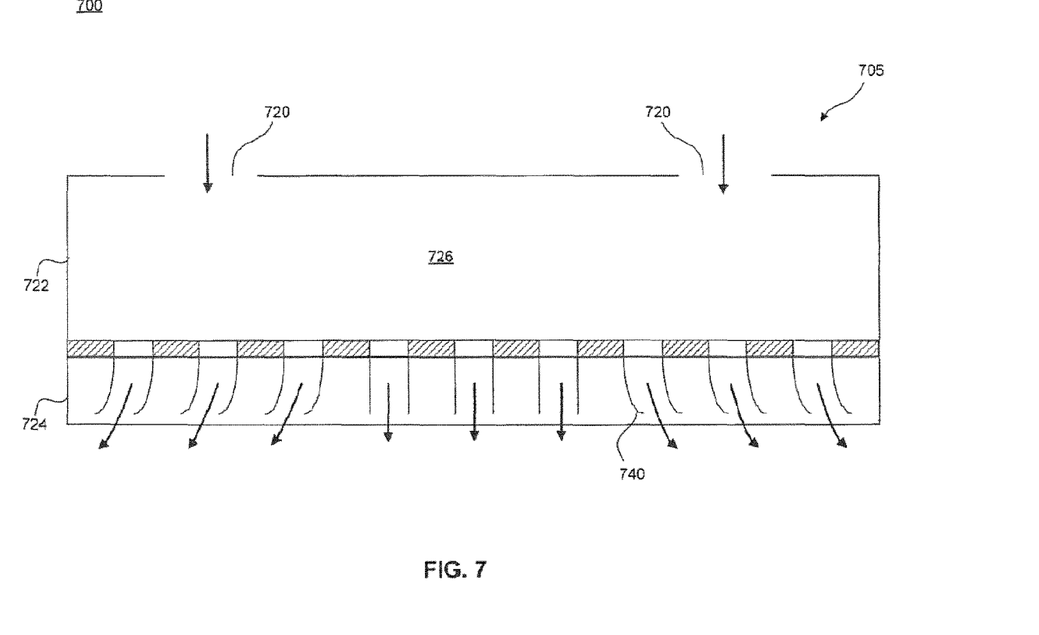
FIG. 7 is a schematic illustration of the fourth nozzle arrangement according to FIG. 6.

A cross-sectional view of nozzle arrangement 700 is depicted in FIG. 7 according to another embodiment. Like nozzle arrangement 600, nozzle arrangement 700 includes nozzle 705 has a housing 722 (enclosing a nozzle cavity 726) and a nozzle tip 724. Inlets 720 supply gas to nozzle cavity 726. Nozzle tip 724 includes a plurality of flow directing vanes 740. Flow directing vanes 740 create a non-uniform flow distribution profile across the exit of the gas supply nozzle tip 724. Like the examples described above, this non-uniform flow distribution profile may be used to cool the reticle more uniformly. Flow directing vanes 740 redistribute the gas from inlets 720 to create a predetermined non-uniform flow distribution profile. Like the exemplary embodiment described above, greater volume of gas flow may be directed towards the outer portions of the top surface of the patterning device (such as top surface 204 of patterning device 203) to combat stagnant gas at the outer portions of the patterning device.

In one embodiment, vanes 740 may be fixed. In another embodiment, vanes 740 may be repositioned by angle control means that optimizes the gas flow for different patterning devices. For example, a mini-electric motor-encoder may be coupled to each vane 740 to control the angle of each vane 740. Thus, the angle control means may individually control the angle of each vane 740 for each patterning device.

The exemplary embodiments described above have largely been discussed in conjunction with a non-uniform flow distribution profile based on variation in volume. In another embodiment, a nozzle arrangement may also create a non-uniform distribution profile based on a variation in velocity. Increasing air flow improves cooling uniformity. An air amplifier may increase the velocity of select portions of the gas flow as desired. By implementing an air amplifier in a nozzle arrangement, the nozzle may increase the velocity of desirable portions of the flow distribution profile. For example, an air amplifier may be placed at either side of a gas supply nozzle to effectuate more uniform cooling across the entire top surface of the patterning device (such as top surface 204 of patterning device 203).

In one example, distributing greater volume or velocity of gas flow to either side of the gas supply nozzle 205, 305, 405, etc. mitigates the reduction of cooling power at either side of the top surface 204 of the patterning device 203. Yet asymmetric cooling power may also occur at portions distal to the gas supply nozzle 205, 305, 405, etc. relative portions proximate to the gas supply nozzle 205, 305, 405, etc. Thus, it may be desirable to create a non-uniform flow at portions distal to the gas supply nozzle 205, 305, 405, etc. relative to portions proximate the gas supply nozzle 205, 305, 405, etc.

Figure 8:
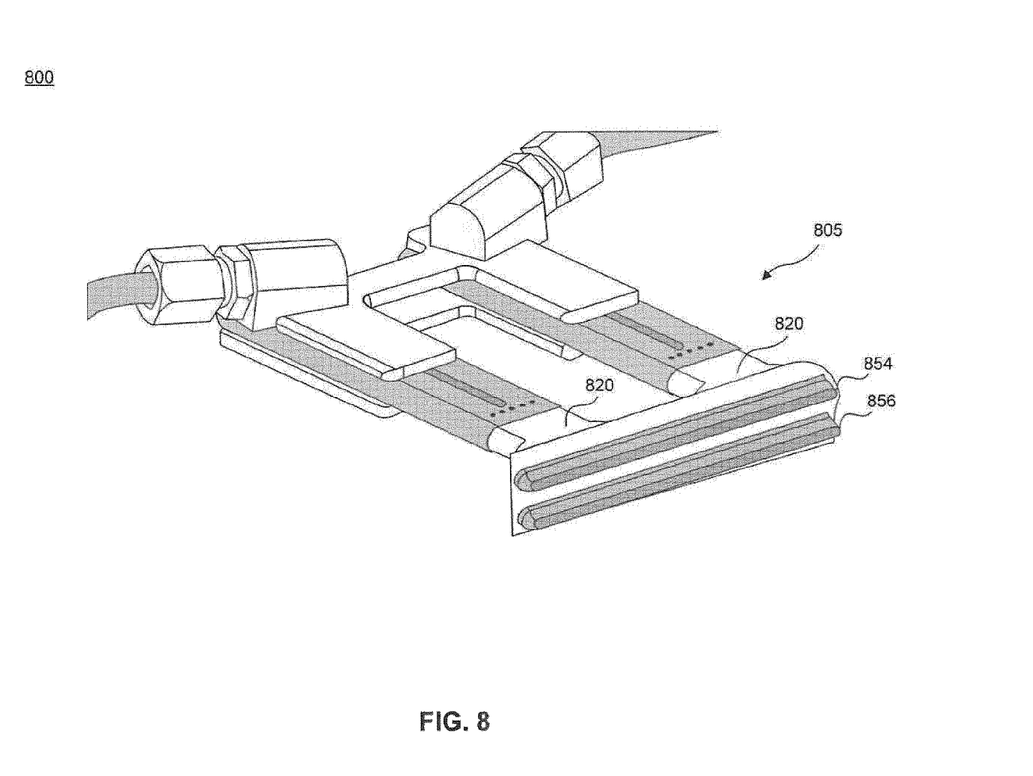
FIG. 8 illustrates a fifth nozzle arrangement according to an exemplary embodiment of the invention.
Figure 9:
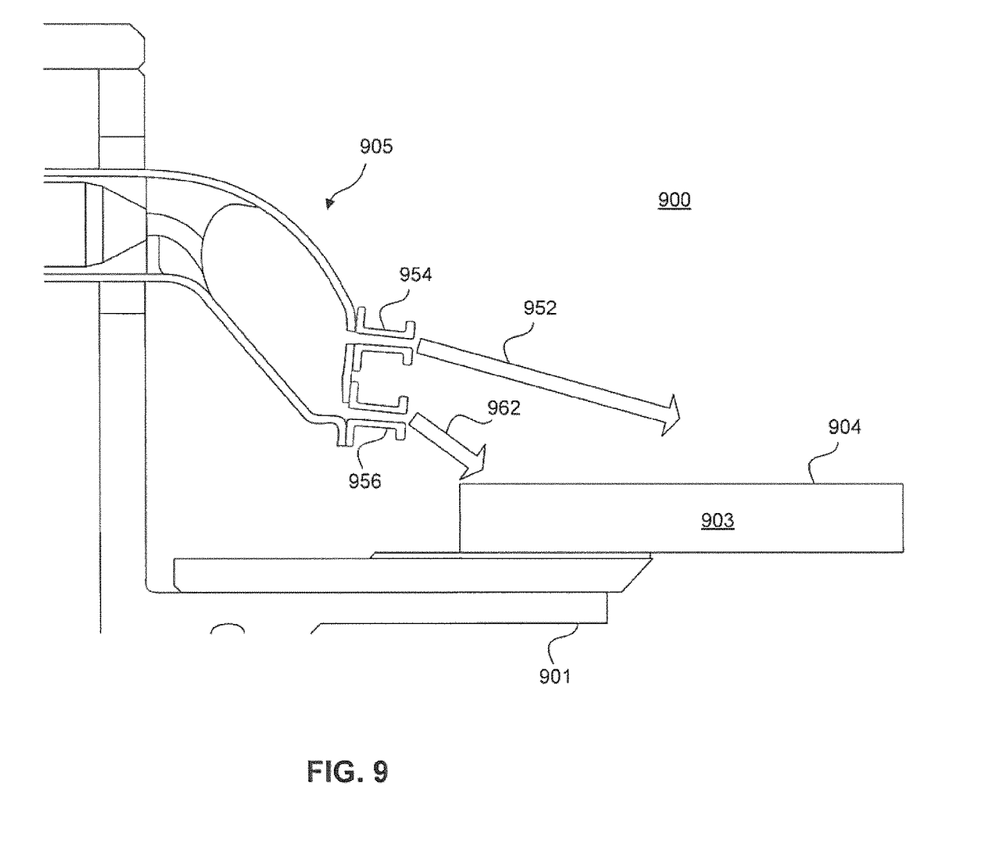
FIG. 9 is a schematic illustration of a side view of the fifth nozzle arrangement of FIG. 8 according to an exemplary embodiment of the invention.

In yet another exemplary embodiment, as shown in FIG. 8, nozzle arrangement 800 includes a gas supply nozzle 805 having inlets 820, a first nozzle tip 854, and a second nozzle tip 856 in a stacked arrangement. FIG. 9 shows a side view of the stacked nozzle arrangement 905. First nozzle tip 954 directs high-velocity gas flow 952 at a shallow angle toward a distal portion of top surface 904 of patterning device 903. Second nozzle tip 956 directs a lower-velocity gas flow 962 at a steeper angle toward a proximate portion of top surface 904. Thus, stacked nozzle arrangement 905 may non-uniformly distribute gas flow so as to reduce asymmetrical cooling of patterning device 903.

The descriptions above are intended to be illustrative, not limiting. The approaches described herein may be used independently or in combination to create a non-uniform flow distribution profile at the nozzle exit to achieve more uniform cooling at the reticle surface. Particular details of the nozzle arrangements may be optimized for cooling uniformity and symmetry. Thus, it will be apparent to one skilled in the art that modifications may be made to the present invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A temperature control system, comprising:
    a support configured to support an object, the object having a first surface and a second surface, wherein either side of the object is configured to have a relative temperature difference compared to a center of the object; and
    a gas supply nozzle, the gas supply nozzle configured to supply a gas flow across the first surface and configured to produce a non-uniform gas flow profile exiting the gas supply nozzle by unevenly distributing a volume or a velocity of the gas flow across the either side of the object relative to the center of the object corresponding to the relative temperature difference across the object.

2. The temperature control system of claim 1, wherein the gas supply nozzle provides a larger volume of gas flow toward the either side of the object than toward the center of the object.

3. The temperature control system of claim 1, wherein the gas supply nozzle provides a greater velocity of gas flow toward the either side of the object than toward the center of the object.

4. The temperature control system of claim 1, wherein the gas supply nozzle provides a greater volume and a greater velocity of gas flow toward the either side of the object than toward the center of the object.

5. The temperature control system of claim 1, wherein:
    the gas supply nozzle comprises a flow distribution plate including gas outlet holes of constant size along a length of the gas supply nozzle; and
    an uneven distribution of the gas outlet holes produces the non-uniform gas flow profile.

6. The temperature control system of claim 1, wherein:
the gas supply nozzle comprises a flow distribution plate including gas outlet holes of various sizes along a length of the gas supply nozzle;
a distribution of the gas outlet holes according to size produces the non-uniform gas flow profile; and
the distribution of the gas outlet holes according to size is non-uniform.

7. The temperature control system of claim 1, wherein:
the gas supply nozzle comprises a nozzle tip including a nozzle tip opening along a length of the nozzle tip; and
varying a height of the nozzle tip opening produces the non-uniform gas flow profile.

8. The temperature control system of claim 1, wherein:
the gas supply nozzle comprises a plurality of flow directing vanes along a length of the gas supply nozzle; and
the plurality of flow directing vanes create the non-uniform gas flow profile.

9. The temperature control system of claim 8, wherein:
an angle control encoder is coupled to each of the plurality of flow directing vanes and is configured to individually control an angle of each flow directing vane.

10. The temperature control system of claim 1, wherein:
the gas supply nozzle comprises a plurality of air amplifiers; and
the plurality of air amplifiers create the non-uniform gas flow profile.

11. The temperature control system of claim 1, wherein:
the gas supply nozzle comprises stacked nozzle tips; and
the stacked nozzle tips have different gas flow exit angles and gas flow velocities to create the non-uniform gas flow profile.

12. A lithographic apparatus, comprising:
an illumination system configured to condition a radiation beam;
a patterning device, the patterning device having a first surface and a second surface, wherein either side of the patterning device is configured to have a relative temperature difference compared to a center of the patterning device, the patterning device being configured to impart the radiation beam with a pattern in its cross-section to form a patterned radiation beam;
a patterning device support configured to support the patterning device;
a gas supply nozzle, the gas supply nozzle configured to supply a gas flow across the first surface and configured to produce a non-uniform gas flow profile exiting the gas supply nozzle by unevenly distributing a volume or a velocity of the gas flow across the either side of the patterning device relative to the center of the patterning device corresponding to the relative temperature difference across the patterning device;
a substrate table configured to hold a substrate; and
a projection system configured to project the patterned radiation beam onto a target portion of the substrate.

13. The lithographic apparatus of claim 12, wherein the gas supply nozzle provides a larger volume of gas flow toward the either side of the patterning device than toward the center of the patterning device.

14. The lithographic apparatus of claim 12, wherein the gas supply nozzle provides a greater velocity of gas flow toward the either side of the patterning device than toward the center of the patterning device.

15. The lithographic apparatus of claim 12, wherein the gas supply nozzle provides a greater volume and a greater velocity of gas flow toward the either side of the patterning device than toward the center of the patterning device.

16. The lithographic apparatus of claim 12, wherein:
the gas supply nozzle comprises a flow distribution plate including gas outlet holes of constant size along a length of the gas supply nozzle; and
an uneven distribution of the gas outlet holes produces the non-uniform gas flow profile.

17. The lithographic apparatus of claim 12, wherein:
the gas supply nozzle comprises a flow distribution plate including gas outlet holes of various sizes along a length of the gas supply nozzle; and
a distribution of the gas outlet holes according to size produces the non-uniform gas flow profile.

18. The lithographic apparatus of claim 17, wherein the distribution of the gas outlet holes according to size is non-uniform.

19. The lithographic apparatus of claim 12, wherein:
the gas supply nozzle comprises a flow distribution plate including an opening along a length of the gas supply nozzle; and
varying a height of the opening produces the non-uniform gas flow profile.

20. The lithographic apparatus of claim 12, wherein:
the gas supply nozzle comprises a plurality of flow directing vanes along a length of the gas supply nozzle; and
the plurality of flow directing vanes create the non-uniform gas flow profile.

21. The lithographic apparatus of claim 20, wherein:
an angle control encoder is coupled to each of the plurality of flow directing vanes and is configured to individually control an angle of each flow directing vane.

22. The lithographic apparatus of claim 12, wherein:
the gas supply nozzle comprises a plurality of air amplifiers; and
the air amplifiers create the non-uniform gas flow profile.

23. The lithographic apparatus of claim 12, wherein:
the gas supply nozzle comprises stacked nozzle tips; and
the stacked nozzle tips have different gas flow exit angles and gas flow velocities to create the non-uniform gas flow profile.

24. A temperature control system, comprising:
a support configured to support an object, the object having a first surface and a second surface, wherein either side of the first surface of the object is configured to have a relative temperature difference compared to a center of the first surface of the object; and
a gas supply nozzle comprising a nozzle tip including a nozzle tip opening along a length of the nozzle tip, the gas supply nozzle configured to:
supply a gas flow across the first surface; and
produce a non-uniform gas flow profile exiting the gas supply nozzle by unevenly distributing a volume or a velocity of the gas flow across the either side of the first surface of the object relative to the center of the first surface of the object corresponding to the relative temperature difference across the object,
wherein varying a height of the nozzle tip opening produces the non-uniform gas flow profile.

* * * * *